(12) United States Patent
Hashimoto

(10) Patent No.: US 7,863,529 B2
(45) Date of Patent: Jan. 4, 2011

(54) ELECTRONIC COMPONENT

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 183 days.

(21) Appl. No.: 12/236,575

(22) Filed: Sep. 24, 2008

(65) Prior Publication Data

US 2009/0114441 A1    May 7, 2009

(30) Foreign Application Priority Data

Nov. 5, 2007   (JP)   ............... 2007-287634

(51) Int. Cl.
H01L 23/02   (2006.01)
H05K 5/06   (2006.01)

(52) U.S. Cl. ..................... 174/564; 174/560

(58) Field of Classification Search ............... 174/350, 174/366, 377, 382, 564, 560; 361/816, 818
See application file for complete search history.

(56) References Cited

U.S. PATENT DOCUMENTS 7,301,243 B2   11/2007   Suga et al.
2005/0236171 A1 *   10/2005   Garcia ................... 174/35 GC
2007/0008051 A1   1/2007   Tsuda et al.

FOREIGN PATENT DOCUMENTS

| JP | 08-018390 | 1/1996 |
|---|---|---|
| JP | 11-087406 | 3/1999 |
| JP | 11-097584 | 4/1999 |
| JP | 2000-077458 | 3/2000 |
| JP | 2003-092382 | 3/2003 |
| JP | 2004-215218 | 7/2004 |
| JP | 2006-066808 | 3/2006 |
| JP | 2006-237200 | 9/2006 |
| JP | 2007-019942 | 1/2007 |

* cited by examiner

*Primary Examiner*—Hung V Ngo
(74) *Attorney, Agent, or Firm*—Harness, Dickey & Pierce, P.L.C.

(57) ABSTRACT

An electronic component includes: a first substrate; a second substrate; a sealing member surrounding a sealing space formed between the first substrate and the second substrate; and a functional element at least a part of which is disposed in the sealing space. In the electronic component, the sealing member includes a core part formed on the first substrate and having elasticity and a metal film formed on a surface of the core part, and the metal film is bonded to the second substrate.

11 Claims, 12 Drawing Sheets

ELECTRONIC COMPONENT

BACKGROUND

1. Technical Field

The present invention relates to an electronic component such as a surface acoustic wave element.

2. Related Art

Electronic components on which a functional element such as a semiconductor element is mounted in a manner allowing an active face thereof to face a substrate are used in various ways. Such electronic components use the functional element itself as a substrate for forming a sealing space. In the electronic components, the functional element is disposed in a manner allowing an active face thereof to face a substrate, so that the active face is positioned inside the sealing space that is formed between the substrate and the functional element. Here, in such electronic components, measures for maintaining an environment inside the sealing space are taken in order to secure normal operation of the electronic components. For example, JP-A-11-87406, JP-A-11-97584, JP-A-2000-77458, and JP-A-2003-92382 disclose a method for sealing an active face in a sealing space by bonding a functional element and a substrate with resin or solder.

However, it has been required to improve air-tightness of the sealing space in related art electronic components.

SUMMARY

An advantage of the present invention is to provide an electronic component in which air-tightness of a sealing space is improved.

The present invention employs structures of the following aspect. An electronic component according to an aspect of the invention includes: a first substrate; a second substrate; a sealing member surrounding a sealing space formed between the first substrate and the second substrate; and a functional element at least a part of which is disposed in the sealing space. In the electronic component, the sealing member includes a core part formed on the first substrate and having elasticity and a metal film formed on a surface of the core part, and the metal film is bonded to the second substrate.

According to the aspect, the core part elastically deforms, so that even if a surface of the region, contacting the sealing member, of the second substrate has an uneven shape or the second substrate has a warpage, the metal film and the second substrate are favorably bonded to each other in a sufficient bonding area. Thus, the sealing member can provide sufficient air-tightness in the sealing space. That is, when the sealing member and the second substrate are relatively compressed in the bonding of the first substrate and the second substrate, the core part elastically deforms together with the metal film in a manner following a surface shape of the second substrate. Therefore, a contacting area between the second substrate and the metal film increases. Accordingly, the metal film and the second substrate are bonded to each other with sufficient strength.

Further, since the core part elastically deforms, even if the first substrate and the second substrate have different thermal expansion coefficients from each other, the bonding state between the metal film and the second substrate can be maintained. Even in a case where a peeling strength is generated between the first substrate and the second substrate in a heat cycle test and the like, the sealing member deforms to follow deformation of the first substrate and the second substrate due to the core part that elastically deforms. Thus, air-tightness of the sealing space can be favorably maintained.

In the electronic component of the aspect, it is preferable that a bonding metal film metal-bonded with the metal film be formed in a region, the region contacting with the sealing member, of the second substrate.

According to the aspect, the metal film and the bonding metal film are metal-bonded so as to bond the first substrate and the second substrate in a manner forming the sealing space.

In the electronic component of the aspect, it is preferable that the metal film and the bonding metal film be bonded to each other at normal temperature.

According to the aspect, the metal film and the bonding metal film are bonded to each other at normal temperature, being able to suppress occurrence of thermal expansion of the first and second substrates and the functional element. This eventually improves air-tightness reliability of the sealing space. Further, the bonding at normal temperature can prevent the functional element from being damaged by heat.

In the electronic component of the aspect, it is preferable that the sealing member be thermally compressed on the second substrate.

In the aspect, the metal film is thermally compressed to the second substrate so as to be bonded with the second substrate.

The electronic component of the aspect further includes a maintaining member maintaining a bonding state between the metal film and the second substrate.

In the aspect, the maintaining member maintains the bonding state between the metal film and the second substrate, being able to further improve the air-tightness reliability of the sealing space.

In the electronic component of the aspect, it is preferable that the maintaining member surround a periphery of the sealing member.

According to the aspect, the bonding state between the metal film and the second substrate can be more securely maintained. Further, a lateral face, which is at a sealing space side, of the sealing member is not easily contaminated, being able to suppress characteristic change of the functional element.

In the electronic component of the aspect, the functional element of which a characteristic is changed by stress or heat may be placed on a face of one of the first substrate and the second substrate.

According to the aspect, characteristic change of the functional element by external stress or heat stress can be kept to the minimum. That is, even if the electronic component receives external stress or is exposed to an environment having a temperature change to receive heat stress caused by a difference between thermal expansion coefficients of the first and second substrates, the core part elastically deforms, being able to prevent warpage or deformation of the first and second substrates. Therefore, characteristic change of the functional element caused by external stress or heat stress can be suppressed.

In the electronic component of the aspect, the functional element may be directly formed on a face of one of the first substrate and the second substrate.

According to the aspect, even though the functional element is more directly affected by one of the first and second substrates, the core part elastically deforms even when the electronic component receives external stress or heat stress, preventing warpage or deformation of the first and second substrates as the above. Therefore, characteristic change of the functional element caused by external stress or heat stress can be suppressed.

In the electronic component of the aspect, the functional element may be placed and bonded on a face of one of the first substrate and the second substrate.

According to the aspect, even if the electronic component receives external stress or heat stress, the core part elastically deforms as the above, making difficult the functional element bonded to one of the first and second substrates to deform due to the bonding part. Therefore, characteristic change of the functional element caused by external stress or heat stress can be suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
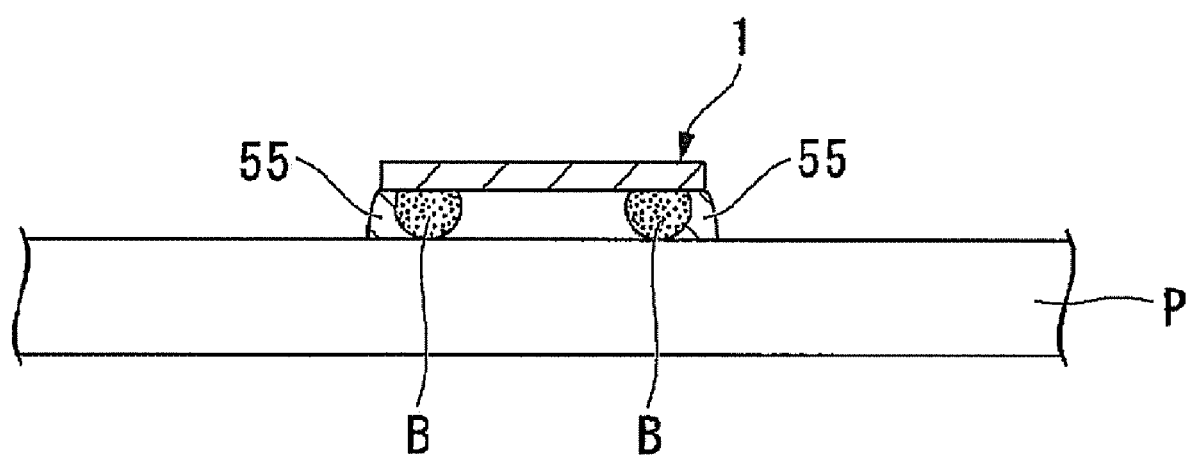
FIG. 1 is a sectional view schematically showing an electronic component according to a first embodiment.
Figure 2:
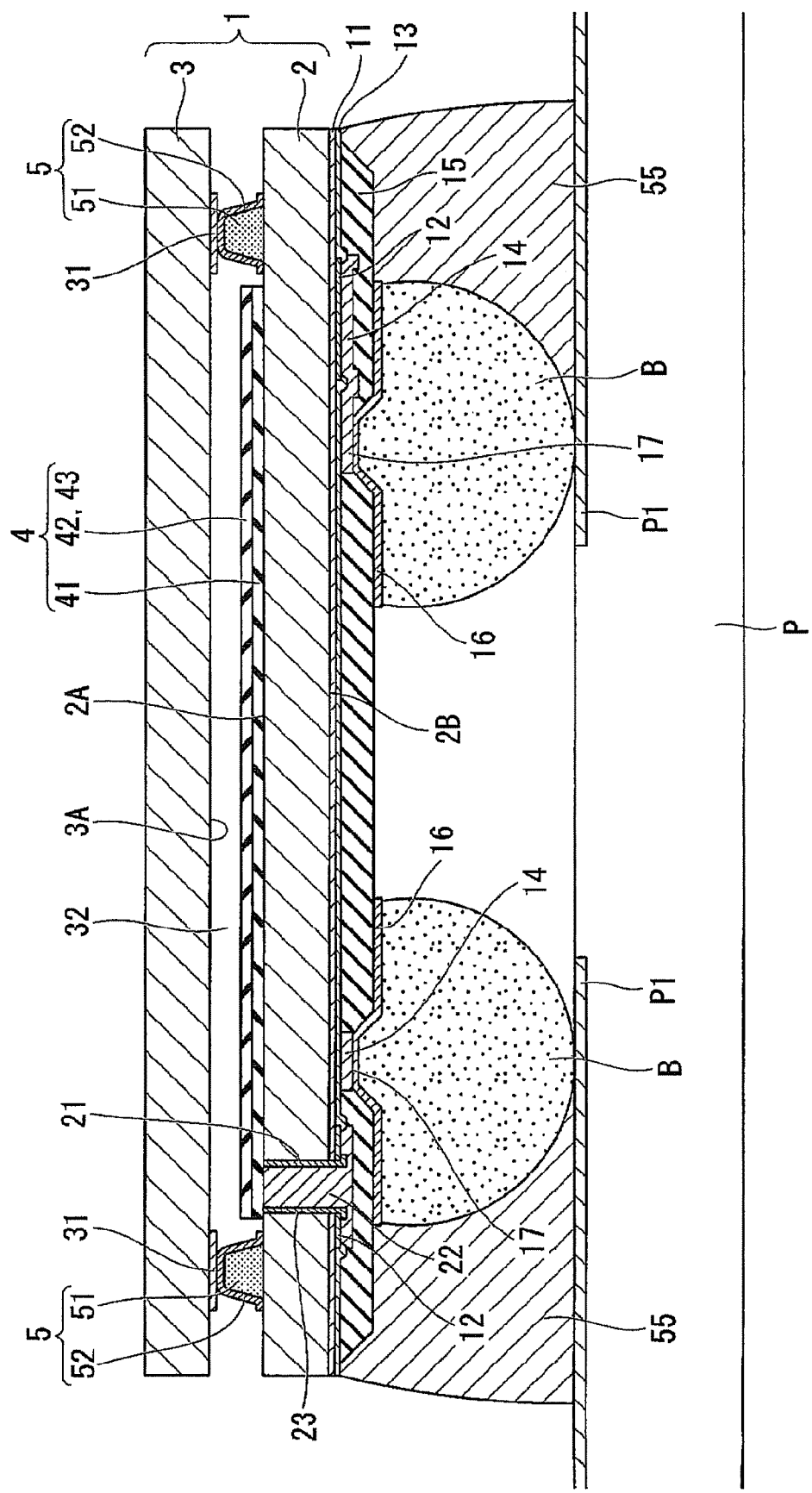
FIG. 2 is an enlarged view of FIG. 1.
Figure 3:
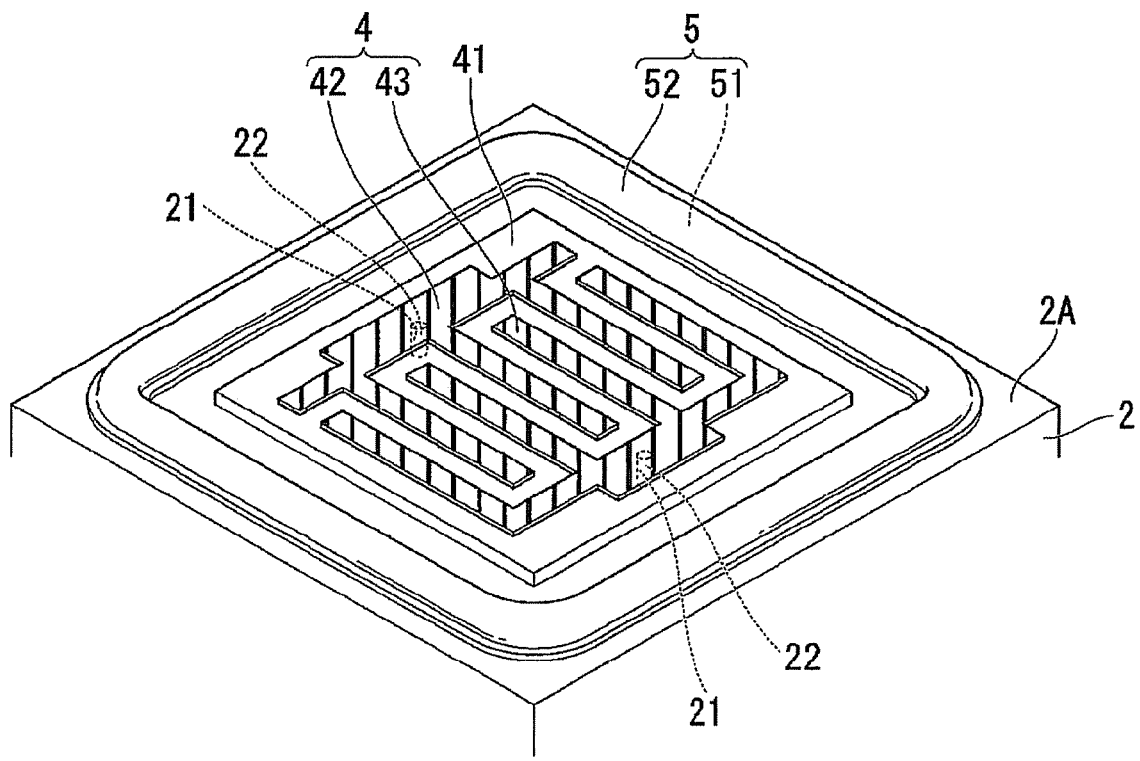
FIG. 3 is a perspective view showing a semiconductor substrate.
Figure 4:
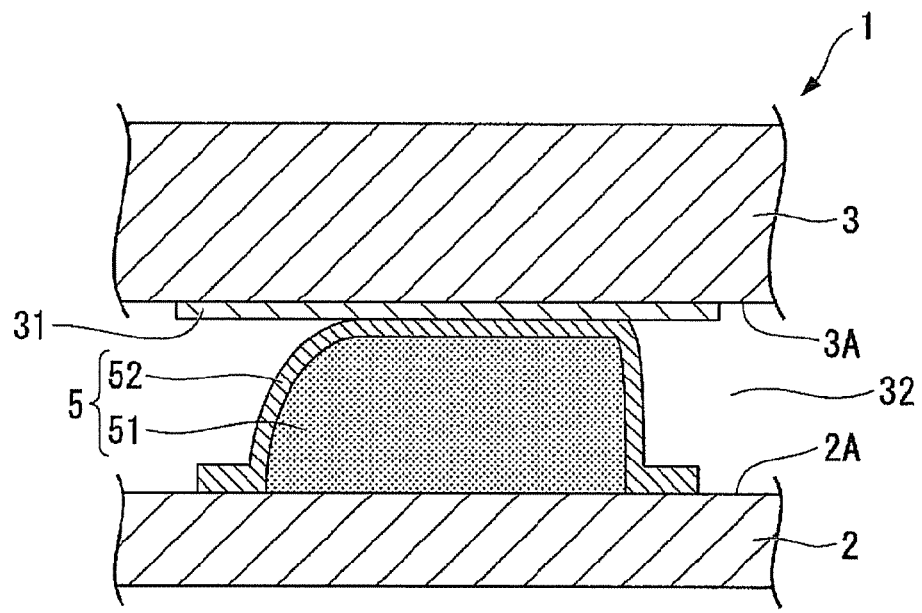
FIG. 4 is a partial enlarged view of FIG. 2.
Figure 5:
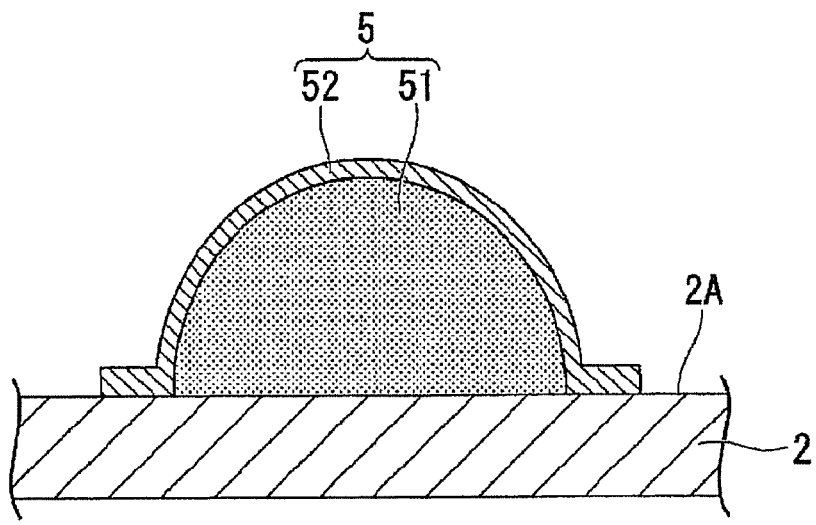
FIG. 5 is an enlarged sectional view showing a sealing member.

An electronic component according to a first embodiment of the present invention will now be described with reference to the accompanying drawings. It should be noted that scales of members in the drawings referred to hereinafter are adequately changed so that they can be recognized. FIG. 1 is a sectional view schematically showing an electronic component. FIG. 2 is an enlarged view of FIG. 1. FIG. 3 is a perspective view showing a semiconductor substrate. FIG. 4 is an enlarged sectional view showing a sealing member. FIG. 5 is an explanatory drawing showing a bonding step of the sealing member and a sealing substrate.

Electronic Component

An electronic component 1 according to a first embodiment is a surface acoustic wave resonator composed of a surface acoustic wave element (hereinafter, referred to as a SAW element) and a semiconductor element, and is mounted on a circuit substrate P by bumps B, as shown in FIG. 1. Referring to FIG. 2, the electronic component 1 includes a semiconductor substrate (a first substrate) 2, a sealing substrate (a second substrate) 3, a surface acoustic wave (SAW) element (a functional element) 4, and a sealing member 5.

The semiconductor substrate 2 is a silicon substrate, for example. On a first face 2A of the semiconductor substrate 2, the SAW element 4 is formed. On a second face 2B of the semiconductor substrate 2, an integrated circuit (not shown), a lower layer 11, an electrode 12, a first insulating film 13, a plurality of first wirings 14, a second insulating film 15, a plurality of second wirings 16, and bumps B are provided.

The integrated circuit includes other electronic elements such as a transistor and a memory element.

The lower layer 11 is made of an insulating material such as silicon dioxide ($SiO_2$), for example, and covers the second face 2B of the semiconductor substrate 2.

The electrode 12 is made of a conductive material such as titanium (Ti), titanium nitride (TiN), aluminum (Al), and copper (Cu), for example, and formed on an under surface of the lower layer 11. The electrode 12 is adequately coupled with the integrated circuit described above.

The first insulating film 13 is made of an insulating material such as polyimide resin, silicone-modified polyimide resin, epoxy resin, silicon-modified epoxy resin, acrylic resin, phenol resin, benzocyclobutene (BCB), and polybenzooxazole (PBO). The first insulating film 13 is formed on a region, on which the electrode 12 is not formed, of the under surface of the lower layer 11.

Each of the plurality of first wirings 14 is made of a material containing at least one of Cu, chrome (Cr), Ti, nickel (Ni), titanium-tungsten (TiW), gold (Au), silver (Ag), Al, nickel-vanadium (NiV), W, TiN, and lead (Pb), or formed by layering at least two of these materials. The first wirings 14 are formed on an under surface of the first insulating film 13 and a part of them is coupled to the electrode 12.

The second insulating film 15 is made of an insulating material similar to that of the first insulating film 13 or an insulating material such as $SiO_2$ and silicon nitride (SiN), and covers a part of the first insulating film 13 and a part of the first wirings 14. In the first wirings 14, a region that is not covered by the second insulating film 15 is a land portion 17.

The second wirings 16 are formed on an under surface of the second insulating film 15 and is coupled to the land portion 17.

The bumps B are made of a conductive material such as lead-free solder and gold, and are coupled to the second wirings 16. The bumps B functions as terminal electrodes of the electronic component 1, and are coupled to a wiring pattern P1 formed on the circuit substrate P.

As shown in FIGS. 2 and 3, the semiconductor substrate 2 is provided with a pair of through-holes 21 penetrating the semiconductor substrate 2. The through-holes 21 are filled with through-electrode 22. A third insulating film 23 is provided at an inner circumferential face of the through-holes 21 of the semiconductor substrate 2, so that the through-electrode 22 and the semiconductor substrate 2 are electrically insulated.

Referring to FIG. 3, one end of one of the pair of through-holes 22 is coupled to an interdigital electrode 42 described later and the other end is coupled through the electrode 12 to the integrated circuit. One end of the other of the pair of through-holes 22 is coupled to an interdigital electrode 43 described later and the other end is coupled through the electrode 12 to the integrated circuit. Thus, the SAW element 4 and the integrated circuit are electrically connected.

Referring to FIG. 2, the third insulating film 23 is formed in order to prevent occurrence of current leak and erosion of the semiconductor substrate 2 by oxygen or moisture. The third insulating film 23 may be made of tetra ethyl ortho silicate (Si(OC$_2$H$_5$)$_4$: hereinafter referred to as TEOS) formed by plasma enhanced chemical vapor deposition (PECVD), that is, PE-TEOS; and TEOS formed by ozone CVD, that is O$_3$-TEOS; or SiO$_2$ formed by CVD. The third insulating film 23 may be made of other insulating material such as a resin material as long as the material has insulating properties. Here, FIG. 2 omits the third insulating film 23 formed on the first insulating film 13 so as to simplify the drawing.

The sealing substrate 3 is a glass substrate, for example. The sealing substrate 3 is disposed to be opposed to the first face 2A of the semiconductor substrate 2 in a manner spacing out with respect to the semiconductor substrate 2. Referring to FIGS. 2 and 4, in a region, overlapping with the sealing member 5 in a planar view, of a first face 3A of the sealing substrate 3, a bonding metal film 31 is formed. The first face 3A faces the semiconductor substrate 2.

The bonding metal film 31 is a film made of a metal material such as Au. The bonding metal film 31 is formed in the region overlapping with the sealing member 5 in a planar view to have a rectangular frame shape.

The sealing substrate 3 is bonded to the semiconductor substrate 2 with the sealing member 5 so as to form a sealing space 32 surrounded by the sealing member 5 between the substrates. In the sealing space 32, the SAW element 4 is sealed. It is preferable that the sealing space 32 be substitution-sealed or vacuum-sealed, that is, the inside of the sealing space 32 be substituted with dry air or nitrogen, or the sealing space 32 have lower pressure than that outside thereof in order to suppress surface oxidation of the SAW element 4 or binding of water molecules.

As shown in FIGS. 2 and 3, the SAW element 4 is formed on the first face 2A of the semiconductor substrate 2 and includes a piezoelectric thin film 41 formed on the first face 2A of the semiconductor substrate 2 and a pair of interdigital electrodes 42 and 43 formed on the piezoelectric thin film 41.

The piezoelectric thin film 41 is made of a piezoelectric material such as zinc oxide (ZnO), aluminum nitride (AlN), lithium niobate (LiNbO$_3$), lithium tantalate (LiTaO$_3$), and potassium niobate (KNbO$_3$).

Each of the interdigital electrodes 42 and 43 is made of a conductive material such as Al. Each of the interdigital electrodes 42 and 43 is electrically connected to one end of one of the through-electrodes 22.

The SAW element 4 is covered by a protection film (not shown) made of SiO$_2$, silicon nitride (Si$_3$N$_4$), or TiN, for example.

Referring to FIGS. 2 to 5, the sealing member 5 is formed on the first face 2A of the semiconductor substrate 2 to have a rectangular frame shape surrounding the sealing space 32 in a planar view. The sealing member 5 includes a resin core (core part) 51 made of a resin material having elasticity and a metal film 52 formed on a surface of the resin core 51.

The resin core 51 is made of a photosensitive insulation resin or a thermosetting insulation resin. Specifically, the resin core 51 is made of polyimide resin, acrylic resin, phenol resin, silicone resin, silicone modified polyimide resin, epoxy resin, or the like.

As shown in FIGS. 3 and 5, the resin core 51 is formed to have an approximate vault shape in a state before the sealing member 5 is bonded to the sealing substrate 3. The vault shape means a columnar shape of which an inner face (under face) contacting with the first face 2A of the semiconductor substrate 2 is flat and outer face being non-contacting face is curved. Specifically, the approximate vault shape may have a cross-section in an approximate half circle, an approximate semi-ellipsoid, and an approximate trapezoid.

As shown in FIGS. 2 and 4, if the semiconductor substrate 2 and the sealing substrate 3 are pressed so as to relatively come close each other, the end shape of the resin core 51 elastically deforms to follow the surface shape of the bonding metal film 31.

Therefore, even if the semiconductor substrate 2 and the sealing substrate 3 have a warpage or a swell, the resin core 51 follows the warpage or the swell so as to maintain a favorable sealing state. Further, even if some dirt or cracks are in a sealing region, a favorable sealing state is similarly maintained.

Further, even when a temperature environment of a sealed object is changed in a case where the semiconductor substrate 2 and the sealing substrate 3 are made of different materials so as to have different thermal expansion coefficients from each other, thermal stress is not easily generated at the sealing part because the resin core 51 elastically deforms. Therefore, the inside of the sealing space is not easily subjected to thermal stress.

In a case where the whole of the electronic component 1 (SAW resonator) is externally stressed, the stress is not easily transmitted to the inside of the sealing space due to the elastic deformation of the resin core 51. Therefore, even if a device that is sensitive to heat or stress is disposed inside the sealing space, the device is hardly affected by disturbances, being able to provide a stable electronic component (SAW resonator).

The resin core 51 is formed by photolithography or etching. A quality of material (degree of hardness) and a shape of the resin core 51 are adequately selected and designed depending on a shape and the like of the bonding metal film 31.

The metal film 52 covers the surface of the resin core 51 as shown in FIGS. 3 to 5. The metal film 52 is made of a metal such as Au, TiW, Cu, chrome (Cr), Ni, Ti, W, NiV, Al, palladium (Pd), and lead-free solder, or an alloy of these, and may be a single layer of one of these or a multilayer of these. The metal film 52 deforms to follow the surface shape of the bonding metal film 31 due to the deformation of the resin core 51 and is metal-bonded with the bonding metal film 31.

The metal film 52 is formed by patterning a film formed by sputtering, for example. Alternatively, the metal film 52 may be formed by layering upper-layer films by electroless plating after a lower film is formed by sputtering or electroless plating. Here, it is preferable that the metal film 52 be made of Au especially having an excellent flatting property, as described later, because the resin core 51 deforms to follow the shape of the bonding metal film 31. In a case where the metal film 52 has a layered structure, it is preferable that the outermost layer of the metal film 52 be made of Au that is stable and has an excellent following property to an uneven surface. As is the case with the resin core 51, the metal film 52 is adequately selected and designed depending on the shape and the like of the bonding metal film 31. Thus the outermost layer of the superficial layer of the resin core 51 is a metal so as to provide a high gas-barrier property that has not been obtained in related art resin sealing structures. Thus, the sealing structure of the embodiment of the present invention combines the best properties of metal and resin, compared to related art sealing structures such as a structure employing highly rigid material such as metal that absorbs no stress and a structure employing resin having a low gas-barrier property.

Method for Manufacturing Electronic Component

Figure 6:
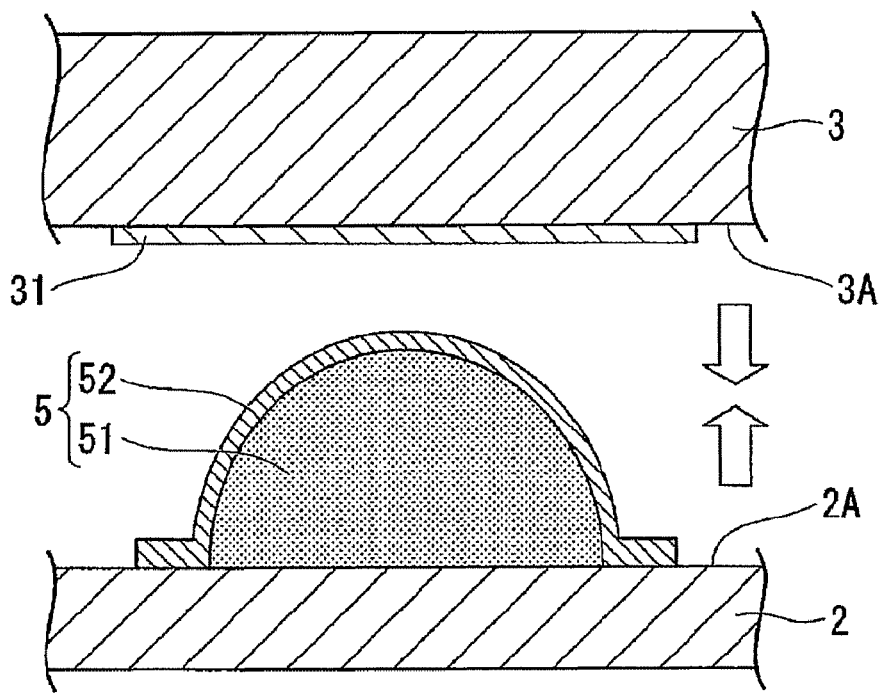
FIG. 6 is an explanatory diagram showing a bonding step of the sealing member and a sealing substrate.

A method for manufacturing the electronic component 1 will be described with reference to FIG. 6. The method is characterized by a bonding step of the semiconductor substrate 2 and the sealing substrate 3, so that only the bonding step will be described. FIG. 6 is a diagram showing the bonding step of the semiconductor substrate and the sealing substrate.

The resin core 51 is formed on the semiconductor substrate 2 in a manner surrounding a forming region of the sealing space 32, and the resin core 51 is covered by the metal film 52. On the other hand, the bonding metal film 31 is formed on the surface of the sealing substrate 3 in a manner surrounding the forming region of the sealing space 32.

Each of the surfaces of the metal film 52 formed on the semiconductor substrate 2 and the bonding metal film 31 formed on the sealing substrate 3 is activated by removing impurities by plasma irradiation, for example.

Then, as shown in FIG. 6, the sealing member 5 provided on the semiconductor substrate 2 is brought into contact with the bonding metal film 31 formed on the sealing substrate 3 so as to be pressed. At this time, the resin core 51 elastically deforms, so that the metal film 52 deforms in accordance with the deformation of the resin core 51 to follow the surface shape of the bonding metal film 31. Therefore, the metal film 52 and the bonding metal film 31 contact with each other in a sufficient area. Since each of the surfaces of the metal film 52 and the bonding metal film 31 is activated, metals of the surfaces are relatively diffused, whereby the metal film 52 and the bonding metal film 31 are metal-bonded with each other. Accordingly, the semiconductor substrate 2 and the sealing substrate 3 are bonded to each other with the sealing member 5 in a manner sealing the SAW element 4 inside, as shown in FIG. 4. Thus, the semiconductor substrate 2 and the sealing substrate 3 are bonded to each other. In the embodiment, a bonding interface has a sealing structure by the metal bonding, substantially improving a gas-barrier property (air-tightness).

Here, if an environmental atmosphere in the bonding is nitrogen, the inside of the sealing space 32 is substituted with nitrogen, and if the atmosphere is other gas, the inside of the sealing space can be substituted with a desired gas. Alternatively, if the bonding is conducted in vacuumed atmosphere, the inside of the sealing space 32 is vacuum-sealed. As described above, if the bonding is conducted after the substrates undergo the plasma irradiation under vacuumed atmosphere and are arranged in the vacuumed atmosphere, the metals are diffused stably even in low temperature in a high degree of activity at the bonding region, being able to provide high bonding reliability.

Then the electronic component 1 is coupled to the wiring pattern P1 through the bumps B formed on the second face 2B of the semiconductor substrate 2, and a resin 55 is applied so as to seal a gap formed between the electronic component 1 and the circuit substrate P.

Electronic Apparatus

Figure 7:
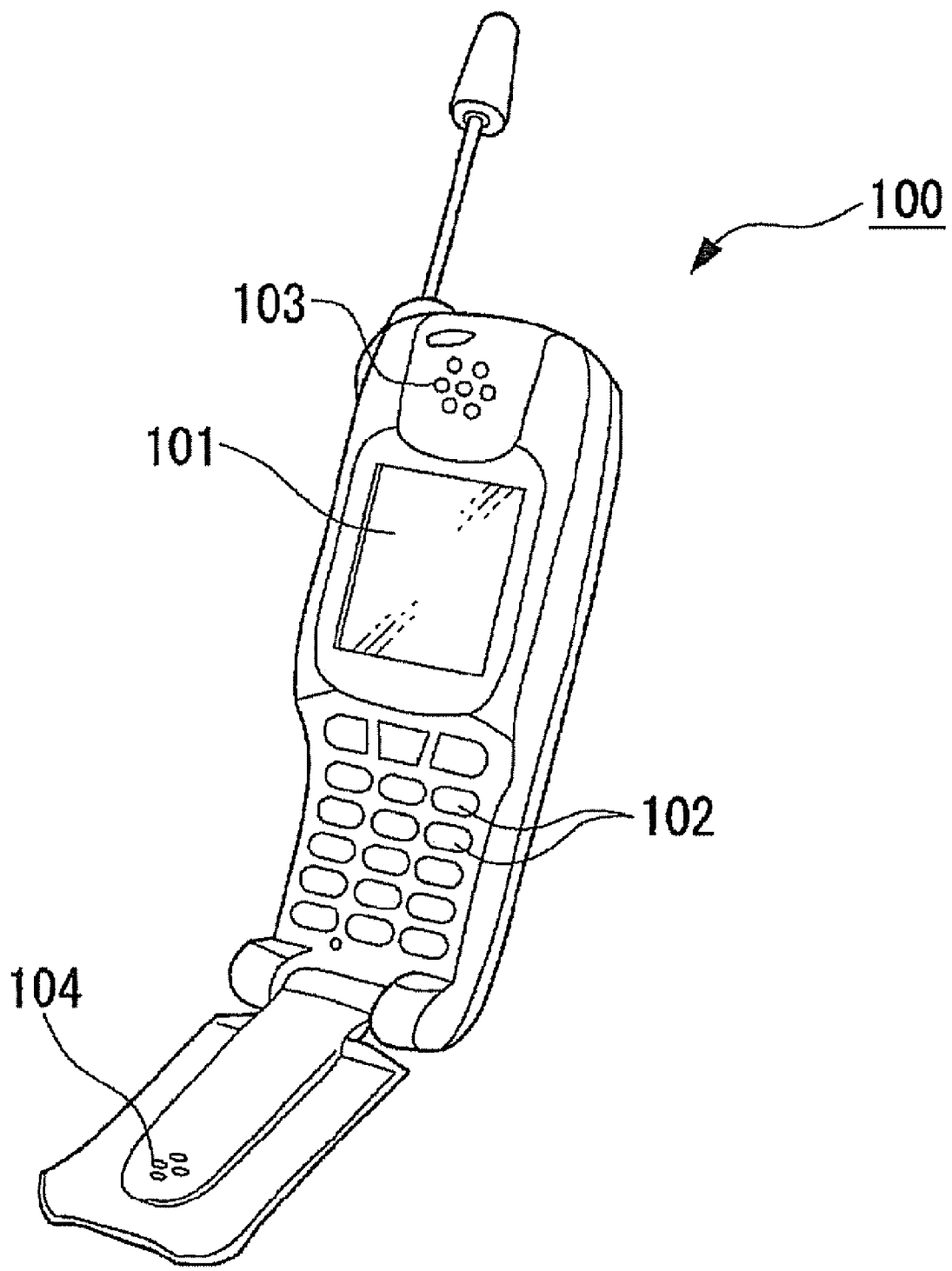
FIG. 7 is a perspective view showing a cellular phone including an electronic component.

The electronic component 1 described above is applied to a cellular phone 100, for example, as shown in FIG. 7. FIG. 7 is a perspective view showing the cellular phone.

This cellular phone 100 includes a display 101, a plurality of operating buttons 102, an ear piece 103, a mouth piece 104, and a main body having the display 101.

As described above, according to the electronic component 1 of the embodiment, the metal film 52 and the bonding metal film 31 are favorably metal-bonded in a sufficient bonding area due to the elastic deformation of the resin core 51. Therefore, sufficient air-tightness in the sealing space 32 by the sealing member 5 can be provided.

Here, the metal film 52 and the bonding metal film 31 are bonded at normal temperature, being able to prevent characteristic change of other elements such as the SAW element 4.

Figure 8A:
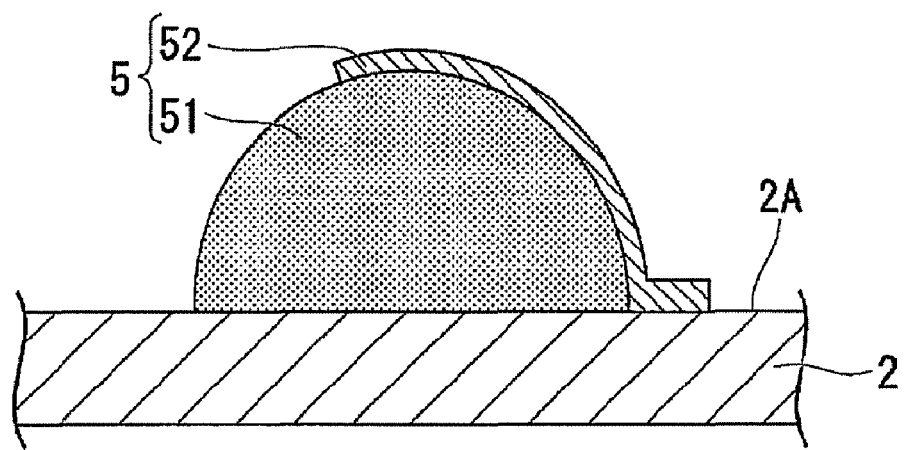
FIGS. 8A and 8B are sectional views showing another structure of a sealing member that is applicable.
Figure 8B:
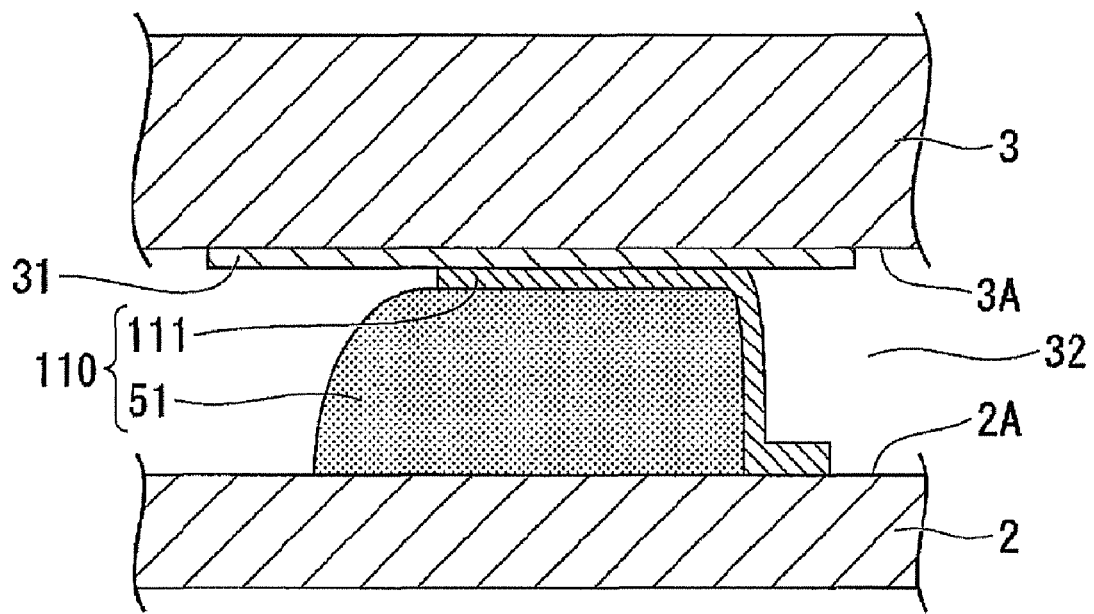

A sealing member 110 having a structure shown in FIGS. 8A and 8B is applicable in the embodiment. Referring to FIG. 8A, a metal film 111 of this sealing member 110 covers a top and an inner face, which faces the sealing space 32, of the resin core 51. If the semiconductor substrate 2 and the sealing substrate 3 are bonded with the sealing member 110 having such structure, the resin core 51 is drawn into the sealing space 32, as shown in FIG. 8B, in a case where the pressure of the sealing space 32 is lower than that outside the sealing space 32. Accordingly, it becomes easy for the inner face of the resin core 51 to contact with the bonding metal film 31. Therefore, even if the metal film 111 does not cover an outer face of the resin core 51, the bonding area of the metal film 111 and the bonding metal film 31 can be sufficiently secured.

Figure 9A:
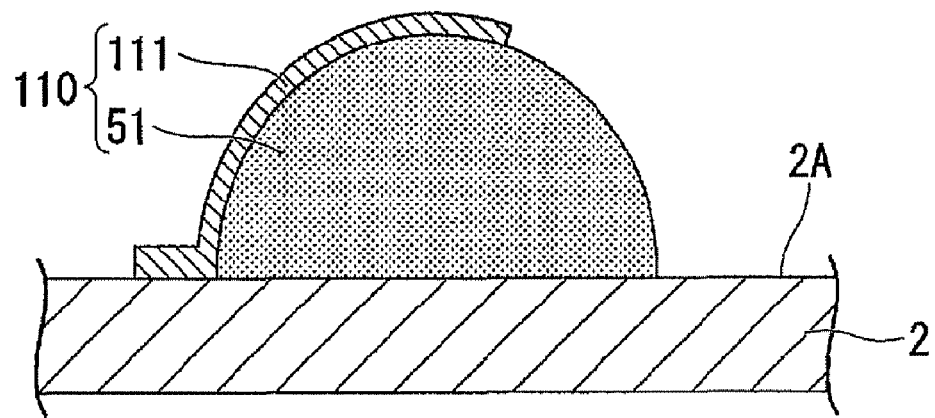
FIGS. 9A and 9B are sectional views showing yet another structure of a sealing member that is applicable.
Figure 9B:
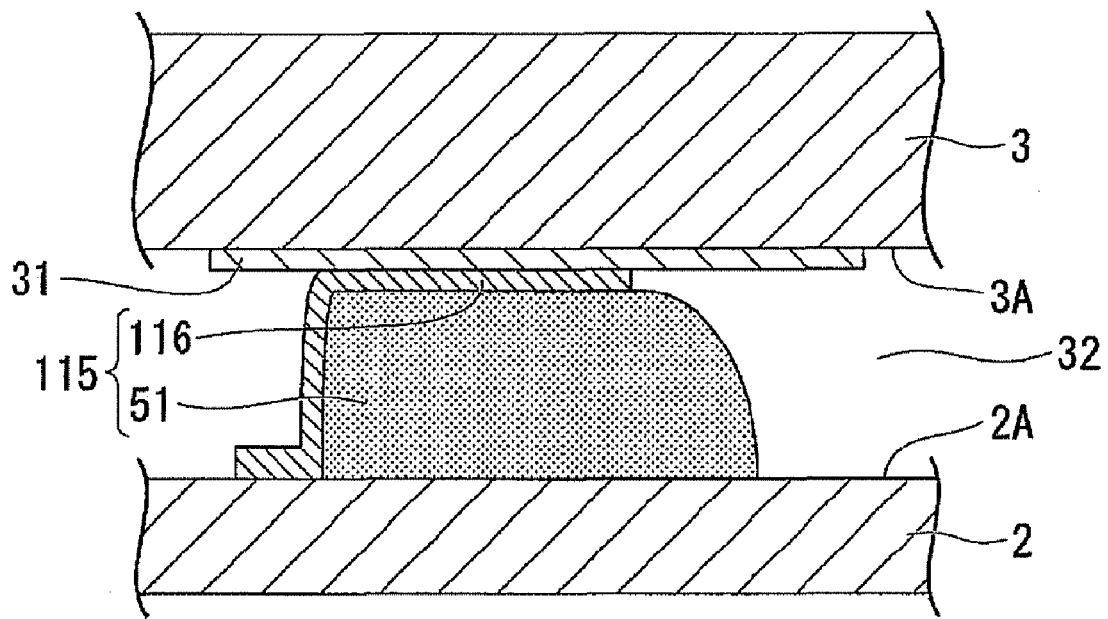

Similarly, a sealing member 115 having a structure shown in FIGS. 9A and 9B is applicable in the embodiment. Here, the pressure of the sealing space 32 is higher than that outside the sealing space 32. Referring to FIG. 9A, a metal film 116 of this sealing member 115 covers a top and an outer face, which is apart from the sealing space 32, of the resin core 51. If the semiconductor substrate 2 and the sealing substrate 3 are bonded to each other with the sealing member 115 having such structure, the resin core 51 is pressed toward the outside of the sealing space 32, as shown in FIG. 9B, because the pressure of the sealing space 32 is higher than that outside the sealing space 32. Accordingly, it becomes easy for the outer face of the resin core 51 to contact with the bonding metal film 31. Therefore, even if the metal film 116 does not cover the inner face of the resin core 51, the bonding area of the metal film 116 and the bonding metal film 31 can be sufficiently secured.

Second Embodiment

Figure 10:
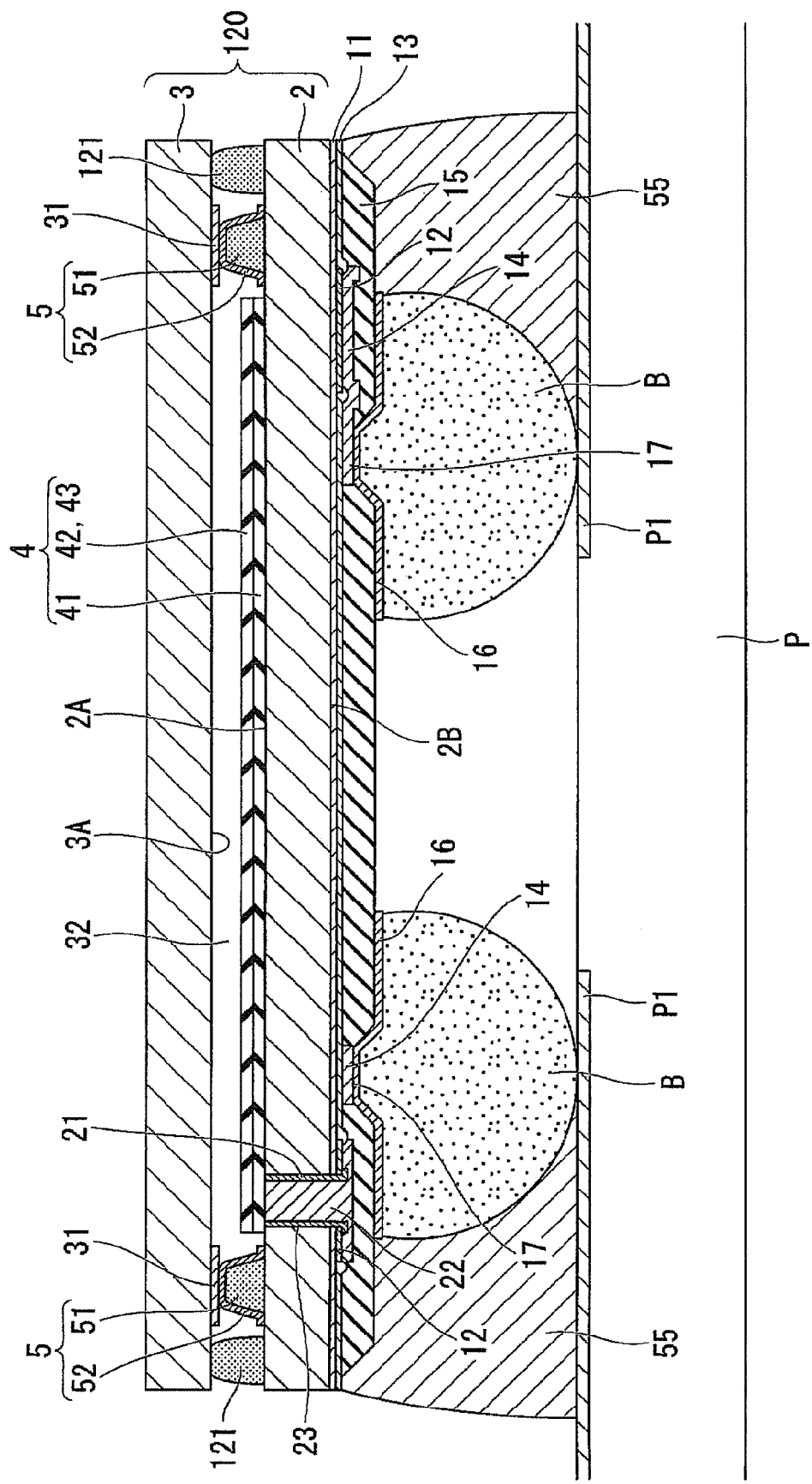
FIG. 10 is a sectional view schematically showing an electronic component according to a second embodiment.
Figure 11:
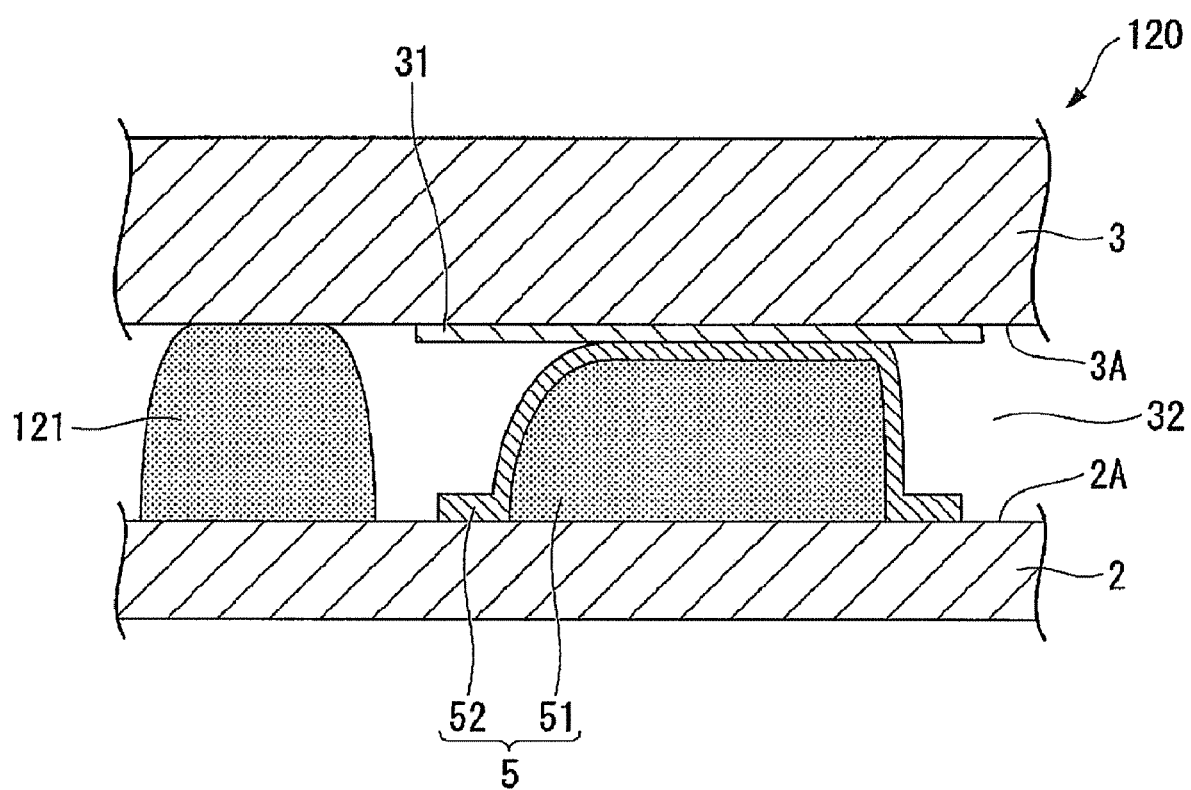
FIG. 11 is a partial enlarged view of FIG. 10.

An electronic component according to a second embodiment of the present invention will now be described with reference to the accompanying drawings. FIG. 10 is a sectional view showing an electronic component, and FIG. 11 is a partial enlarged view of the FIG. 10. The bonding structure of the semiconductor substrate and the sealing substrate in the second embodiment is different from that in the first embodiment, so that the bonding structure will be mainly described. In the second embodiment, elements described in the first embodiment will be given the same reference numerals and the description thereof will be omitted.

Referring to FIG. 10, in an electronic component 120 according to the second embodiment, the semiconductor substrate 2 and the sealing substrate 3 are bonded to each other with the sealing member 5 and an adhesive layer (maintaining member) 121.

The adhesive layer 121 is an adhesive made of epoxy resin or an acrylic resin, for example. The adhesive layer 121 is formed in a rectangular frame shape in a planar view so as to surround the sealing member 5.

The electronic component 120 of the second embodiment has an advantageous effect similar to that of the first embodiment. However, the bonding state between the metal film 52 and the bonding metal film 31 is maintained by the adhesive layer 121, so that air-tightness reliability of the sealing space 32 is further improved. In addition, the adhesive layer 121 surrounds the outer periphery of the sealing member 5, so that characteristic change of the SAW element 4 can be suppressed.

Third Embodiment

Figure 12:
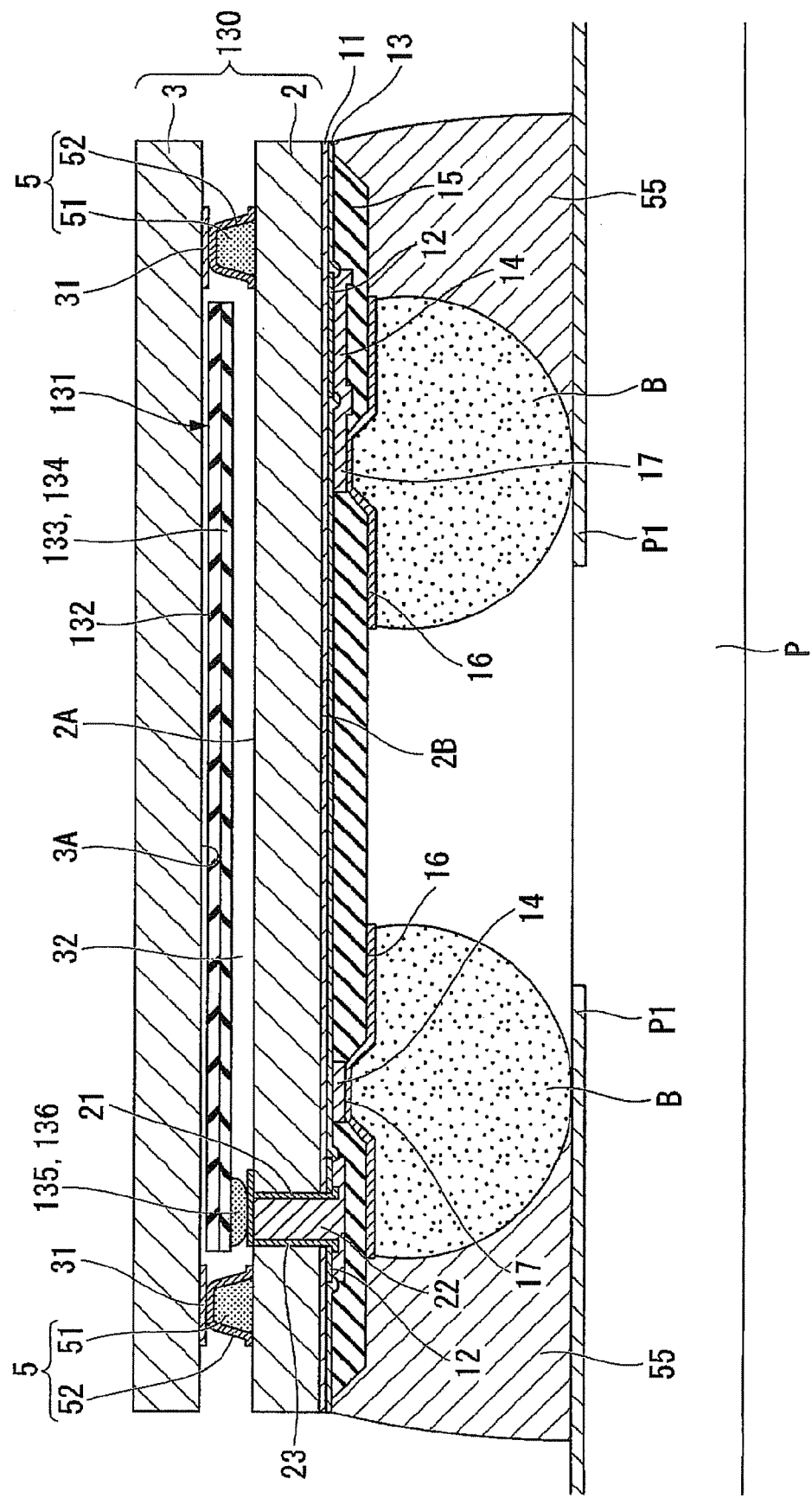
FIG. 12 is a sectional view schematically showing an electronic component according to a third embodiment.
Figure 13:
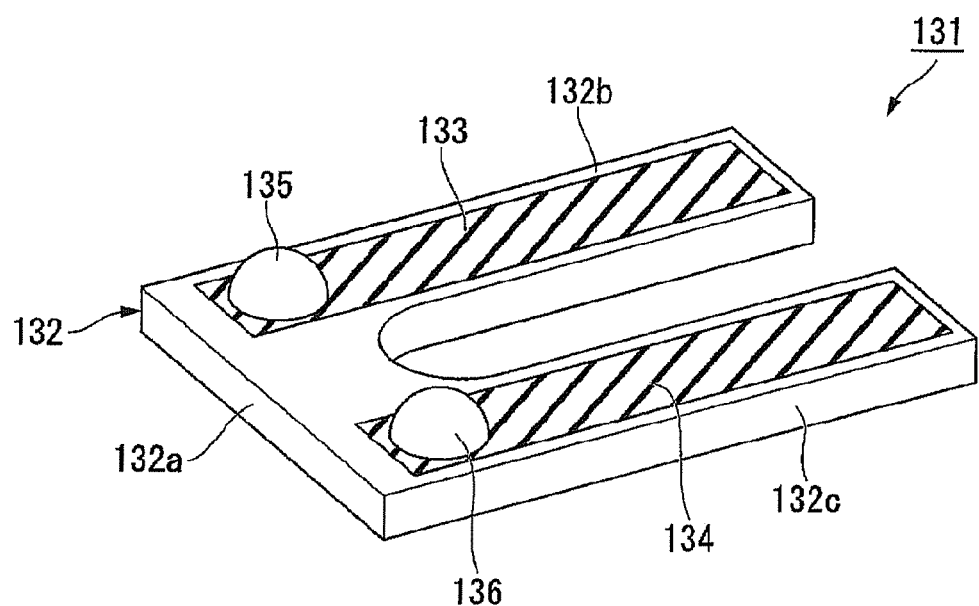
FIG. 13 is a perspective view showing a quartz crystal resonator.

An electronic component according to a third embodiment of the present invention will now be described with reference to the accompanying drawings. FIG. 12 is a sectional view showing an electronic component, and FIG. 13 is a perspective view showing a quartz crystal resonator. The structure of the functional element in the third embodiment is different from that in the first embodiment, so that the structure of the functional element will be mainly described. In the third embodiment, elements described in the first and second embodiments will be given the same reference numerals and the description thereof will be omitted.

Referring to FIG. 12, this electronic component 130 of the third embodiment is provided with a quartz crystal resonator 131 as a functional element. Referring to FIG. 13, the quartz crystal resonator 131 is a tuning-fork type quartz crystal resonator, and includes a crystal piece 132; a pair of excitation electrodes 133 and 134 exciting the crystal piece; and bump electrodes 135 and 136.

The crystal piece 132 is a plate like member having an approximate U-shape in a planar view, that is, having a tuning-fork like planar view in which two arms 132b and 132c extend in a same direction in parallel from a base part 132a.

The excitation electrode 133 is formed, on one face of the crystal piece 132, along the arm 132b from the base part 132a. The excitation electrode 134 is formed, on the one face of the crystal piece 132, along the arm 132c from the base part 132a.

The bump electrodes 135 and 136 are electrically connected with the excitation electrodes 133 and 134 respectively. Referring to FIG. 12, the bump electrode 135 is coupled to a connecting electrode 137 formed on the first face 2A of the semiconductor substrate 2 and electrically connected with one of the pair of through-electrodes 22. The bump electrode 136 is coupled to a connecting electrode 138 formed on the first face 2A of the semiconductor substrate 2 and electrically connected with the other of the pair of through-electrodes 22.

The electronic component 130 having such structure is manufactured by bonding the semiconductor substrate 2 and the sealing substrate 3 after the quartz crystal resonator 131 is mounted on the semiconductor substrate 2.

As above, the electronic component 130 of the third embodiment has a advantageous effect similar to that of the above embodiments. As is the case with the second embodiment, the semiconductor substrate 2 and the sealing substrate 3 may be bonded to each other with the adhesive layer 121.

Figure 14:
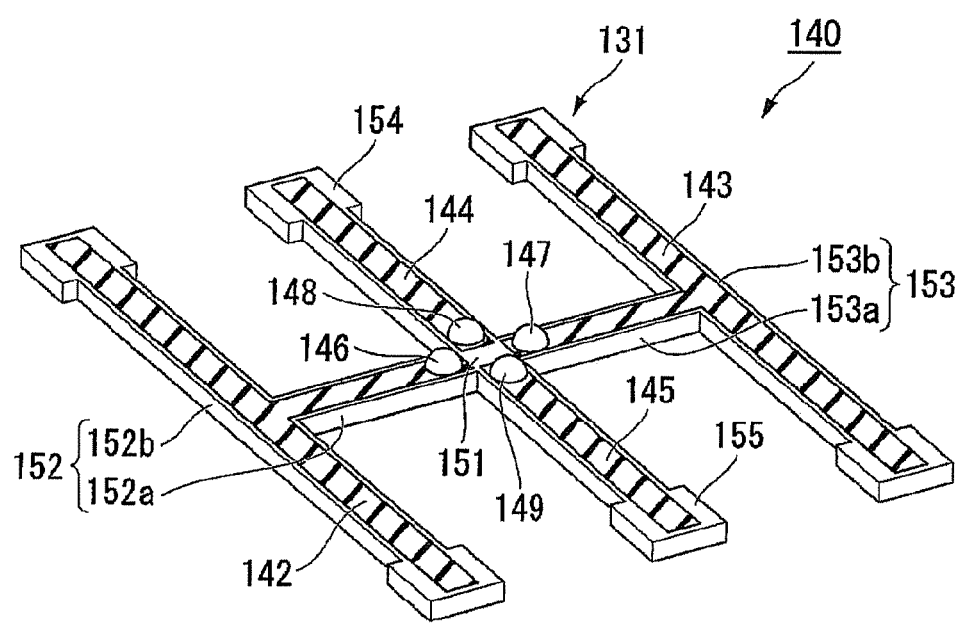
FIG. 14 is a perspective view showing another quartz crystal resonator.

The quartz crystal resonator 131 is not limited to the tuning-fork type quartz crystal resonator, but may be a quartz crystal resonator shown in FIG. 14. This quartz crystal resonator 140 is used in a gyro sensor, for example, and includes a crystal piece 141, driving electrodes 142 and 143, detecting electrodes 144 and 145, and bump electrodes 146 through 149. These electrodes are formed on one face of the crystal piece 141.

The crystal piece 141 includes a fixing part 151, a pair of driving arms 152 and 153, and a pair of detecting arms 154 and 155.

The driving arm 152 includes a base part 152a formed to protrude from the fixing part 151 and an end part 152b connected with the base part 152a. An extending direction of the base part 152a and an extending direction of the end part 152b are approximately orthogonal to each other. The base part 152a is connected to an approximate center of the end part 152b.

The driving arm 153 includes a base part 153a formed to protrude from the fixing part 151 and an end part 153b connected with the base part 153a. An extending direction of the base part 153a and an extending direction of the end part 153b are approximately orthogonal to each other. Therefore, the extending direction of the end part 153b and that of the end part 152b are approximately parallel to each other. A protruding direction of the base part 153a from the base part 151 is opposite to that of the base part 152a. The base part 153a is connected to an approximate center of the end part 153b.

The detecting arms 154 and 155 are formed to protrude from the fixing part 151. A protruding direction of the detecting arm 154 from the fixing part 151 is opposite to that of the detecting arm 155. An extending direction of each of the detecting arms 154 and 155 is approximately orthogonal to the extending direction of each of the base part 152a and 153a and is approximately parallel to the extending direction of each of the end parts 152b and 153b.

The driving electrode 142 is formed on one face of each of the base part 152a and the end part 152b. The driving electrode 143 is formed on one face of each of the base part 153a and the end part 153b. The detecting electrode 144 is formed on one face of the detecting arm 154, and the detecting electrode 145 is formed on one face of the detecting arm 155.

The bump electrodes 146, 147, 148, and 149 are electrically connected with the driving electrode 142, the driving electrode 143, the detecting electrode 144, and the detecting electrode 145 respectively.

Fourth Embodiment

Figure 15:
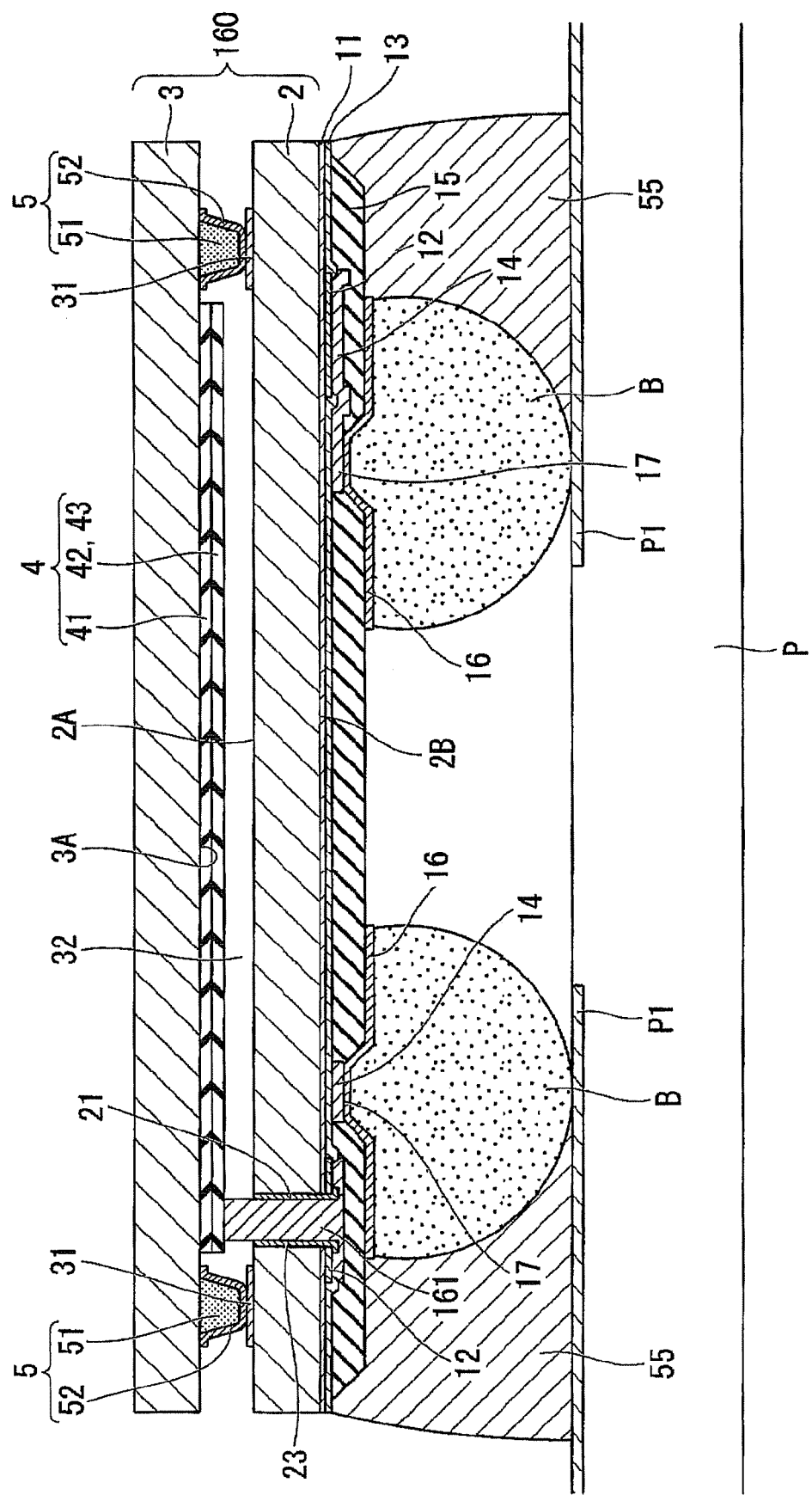
FIG. 15 is a sectional view schematically showing an electronic component according to a fourth embodiment.

An electronic component according to a fourth embodiment of the present invention will now be described with reference to the accompanying drawings. FIG. 15 is a sectional view showing an electronic component. The structure of the functional element in the fourth embodiment is different from that in the first embodiment, so that the structure of the functional element will be mainly described. In this fourth embodiment, elements described in the first through third embodiments will be given the same reference numerals and the description thereof will be omitted.

Referring to FIG. 15, in this electronic component 160 of the fourth embodiment, the SAW element 4 is formed on the first face 3A of the sealing substrate 3. End parts of a pair of through-electrodes 161 are formed in a protruding manner from the first face 2A of the semiconductor substrate 2 so as to be electrically connected with the SAW element 4.

The sealing member 5 is formed on the first face 3A of the sealing substrate 3, and the bonding metal film 31 is formed on the first face 2A of the semiconductor substrate 2.

The electronic component 160 of the fourth embodiment has a similar advantageous effect as that of the above embodiments. As is the case with the second embodiment, the semiconductor substrate 2 and the sealing substrate 3 may be bonded to each other with the adhesive layer 121. Here, the SAW element 4 may be formed on the first face 2A of the semiconductor substrate 2.

It should be understood that the technical scope of the present invention is not limited to the above-mentioned embodiments but applies to various kinds of modifications without departing from the spirit and scope of the present invention.

For example, the metal film and the bonding metal film are metal-bonded, but they may be bonded to each other with a solder or a brazing material, or by thermocompression. Further, the metal film and the bonding metal film are bonded to each other at normal temperature, but they may be bonded to each other at high temperature.

The metal film and the sealing substrate are bonded to each other by bonding the bonding metal film formed on the surface of the sealing substrate and the metal film, but they may be bonded without the bonding metal film.

In the first to third embodiments, the sealing member is formed on one face of the semiconductor substrate, but it may be formed on one face of the sealing substrate. In this case, the bonding metal film is formed on one face of the semiconductor substrate.

In the second embodiment, the adhesive layer is formed to have a rectangular frame shape in a planar view, but the shape is not limited to the rectangle as long as the bonding state between the metal film and the bonding metal film by the sealing member can be maintained. Further, the adhesive layer may be provided inside the sealing space. The bonding state between the metal film and the bonding metal film is maintained by the adhesive layer, but it is not limited to the adhesive layer as long as the bonding state can be maintained.

The functional element is not limited to the SAW element, but it may be other functional elements such as a quartz crystal resonator, micro electro mechanical systems (MEMS), and a liquid crystal layer. Here, as described above, the atmosphere in the sealing space may be adequately selected in accordance with the functional element.

Similarly, the first substrate is not limited to the semiconductor substrate, but may be a substrate made of other materials. The second substrate is not limited to the glass substrate, but may be a substrate made of other materials.

In this case, the first and second substrates are allowed to be electrically connected with each other by the metal film formed on the surface of the resin core.

The electronic component is individually manufactured in the above embodiments, but a plurality of electronic components may be manufactured such that after pieces of sealing substrates are bonded on a semiconductor substrate, the bonded body is divided by dicing or the like. Alternatively, the plurality of electronic components may be manufactured such that after a sealing substrate is bonded on the semiconductor substrate, the bonded body is divided by dicing or the like.

What is claimed is:

1. An electronic component, comprising:
   a first substrate;
   a second substrate;
   a sealing member surrounding a sealing space formed between the first substrate and the second substrate; and
   a functional element at least a part of which is disposed in the sealing space,
   wherein the sealing member includes a core part formed on the first substrate, the core part having elasticity; and
   a metal film is formed on a surface of the core part, the metal film being bonded to the second substrate, and a part of the metal film being separated from the second substrate.

2. The electronic component according to claim 1, wherein a bonding metal film metal-bonded with the metal film is formed in a region, the region contacting with the sealing member, of the second substrate.

3. The electronic component according to claim 2, wherein the metal film and the bonding metal film are bonded to each other at normal temperature.

4. The electronic component according to claim 1, wherein the sealing member is thermally compressed on the second substrate.

5. The electronic component according to claim 1, further comprising:
   a maintaining member maintaining a bonding state between the metal film and the second substrate.

6. The electronic component according to claim 5, wherein the maintaining member surrounds a periphery of the sealing member.

7. The electronic component according to claim 1, wherein the functional element of which a characteristic is changed by at least one of stress and heat is placed on a face of one of the first substrate and the second substrate.

8. The electronic component according to claim 7, wherein the functional element is directly formed on a face of one of the first substrate and the second substrate.

9. The electronic component according to claim 7, wherein the functional element is placed and bonded on a face of one of the first substrate and the second substrate.

10. The electronic component of claim 1, wherein the metal film contacts the first substrate and the second substrate.

11. The electronic component of claim 1, wherein the core member includes side surfaces, and the metal film is formed on side surfaces of the core member.

* * * * *